United States Patent [19]

Fujii et al.

[11] Patent Number: 4,533,822
[45] Date of Patent: Aug. 6, 1985

[54] HEATING RESISTOR OF SINGLE CRYSTAL MANUFACTURING APPARATUS

[75] Inventors: Takashi Fujii; Jisaburo Ushizawa; Masayuki Watanabe, all of Yokohama, Japan

[73] Assignee: Tokyo Shibaura Denki Kabushiki Kaisha, Kawasaki, Japan

[21] Appl. No.: 592,363

[22] Filed: Mar. 22, 1984

[30] Foreign Application Priority Data

Mar. 25, 1983 [JP] Japan .................................. 58-48746

[51] Int. Cl.³ .............................................. H05B 3/10
[52] U.S. Cl. ..................................... 219/553; 219/426; 219/539; 338/217; 338/294; 373/134
[58] Field of Search ............... 219/406, 421, 426, 539, 219/541, 552, 553; 338/217, 218, 283, 284, 287, 294; 373/113, 114, 134

[56] References Cited

U.S. PATENT DOCUMENTS

| 2,966,537 | 12/1960 | Witucki et al. | 373/134 X |
| 3,300,566 | 1/1967 | Walker | 373/113 |
| 3,381,114 | 4/1968 | Nakamura | 219/385 |
| 3,709,998 | 1/1973 | Anthony et al. | 373/134 |
| 3,786,165 | 1/1974 | Barbier et al. | 373/134 X |
| 3,860,736 | 1/1975 | Ford | 373/113 |
| 4,297,562 | 10/1981 | Kamogawa et al. | 219/553 X |
| 4,467,185 | 8/1984 | Moritoki et al. | 219/539 |

FOREIGN PATENT DOCUMENTS 52-039787 10/1977 Japan .

OTHER PUBLICATIONS 54128990, 03001978 Japan—Patent Abstracts of Japan, vol. 3, No. 152 (C-67), Dec. 14, 1979, p. 72 C 67.

Primary Examiner—Volodymyr Y. Mayewsky
Attorney, Agent, or Firm—Oblon, Fisher, Spivak, McClelland & Maier

[57] ABSTRACT

A heating resistor of a single crystal manufacturing apparatus, which comprises a cylindrical side wall portion surrounding a melting pot, a bottom portion supporting the side wall portion, and a plurality of slits formed in the side wall portion and bottom portion, wherein said bottom portion has a maximum thickness which is not greater than that of said side wall portion, and said bottom portion has a minimum inner diameter which falls within a range of 20 to 80% of an inner diameter of a lowermost portion of said side wall portion.

6 Claims, 13 Drawing Figures

F I G. 2
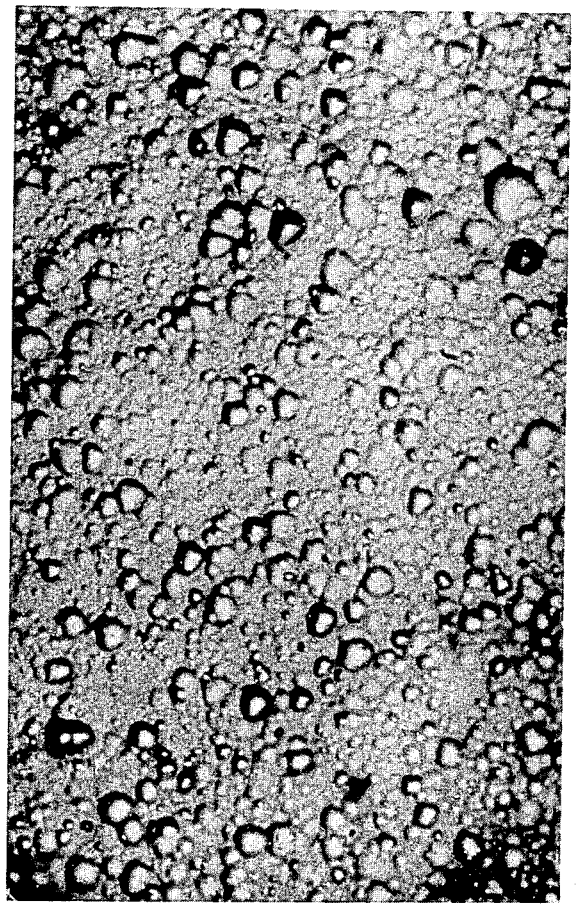
100μ

F I G. 6(A)
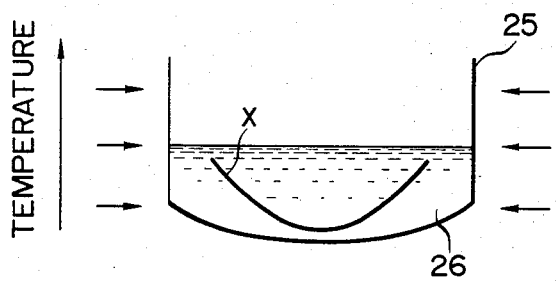
F I G. 6(B)
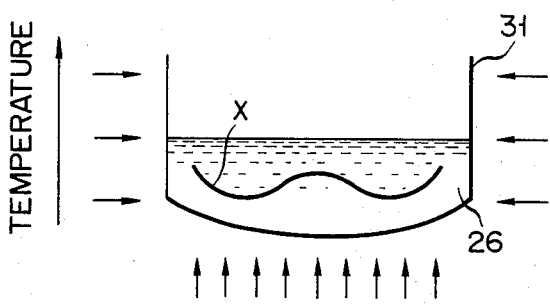
F I G. 6(C)
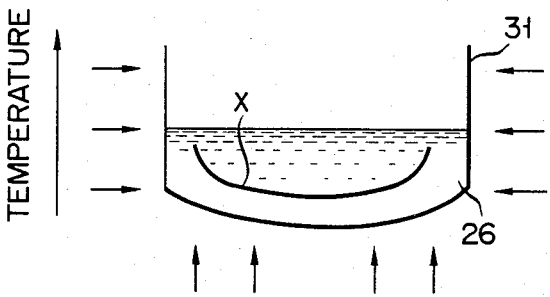

F I G. 8(a)
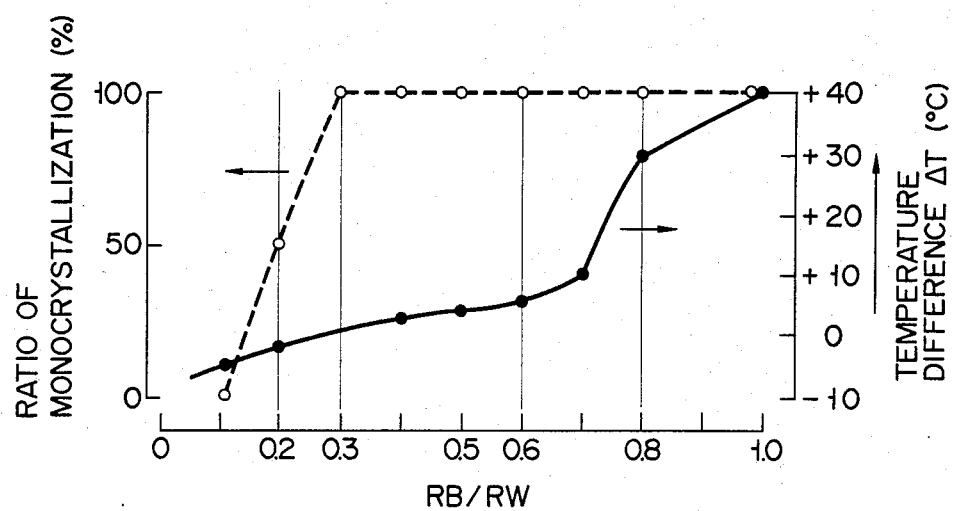
F I G. 8(b)
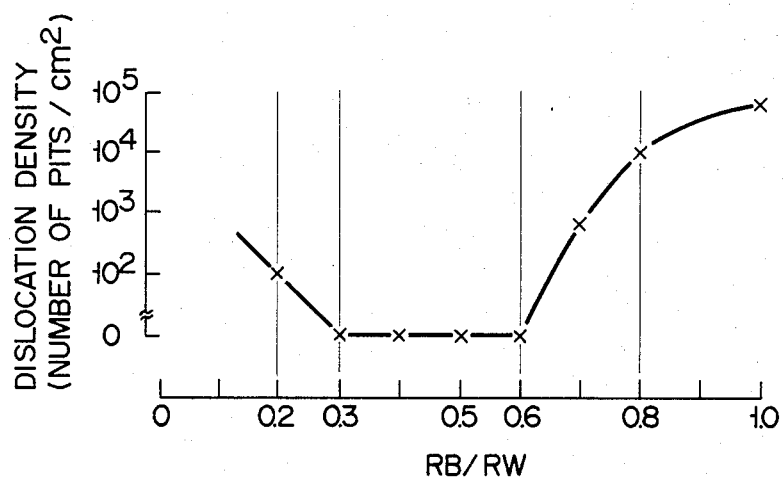

HEATING RESISTOR OF SINGLE CRYSTAL MANUFACTURING APPARATUS

BACKGROUND OF THE INVENTION (a) Field of the Invention

The present invention relates to a heating resistor of a single crystal manufacturing apparatus which is used for manufacturing at high yield a high-quality single crystal which is free from any crystal defect.

(b) Description of the Prior Art

Conventionally, most industrial single crystals are manufactured by methods wherein a crystal material is heated and melted in a melting pot, and a seed crystal is brought into contact with the melt and is then pulled upward while being rotated.

Such methods include the Czochralski method (to be referred to as the CZ method hereinafter) and the liquid encapsulated Czochralski method (to be referred to as the LEC method hereinafter) for manufacturing single crystals containing an element having a high vapor pressure.

In this case, an RF coil or heating resistor is used as a heating medium. However, such a heating resistor is more frequently used to manufacture monocrystalline semiconductors, and is designed to heat the melting pot which is filled with the crystal material from the side surface thereof. For example, a heating resistor used for a monocrystalline silicon manufacturing apparatus for use with the CZ method is generally disposed on the side surface wall portion of the melting pot. On the other hand, a heating resistor used for a monocrystalline GaP or GaAs manufacturing apparatus for use with the LEC method has a side wall portion which coaxially surrounds the melting pot and a bottom portion which supports the side wall portion. It should be noted, however, that the bottom portion is designed only to support the side wall portion.

The latter heating resistor will be described with reference to FIG. 1.

A side wall portion 1 of the heating resistor has a tapered shape. A thickness dW of the side wall portion 1 is greatest at the upper edge thereof. However, a thickness dB of a bottom portion 2 is smallest at a connecting portion between the side portion 1 and the bottom portion 2. The thickness dB then increases in a direction toward a connecting portion 5 integrally formed with a cylindrical portion 4 of a power supply electrode portion 3. In this manner, the mechanical strength of the bottom portion 2 is increased. The thickness dW of the side wall portion 1 is measured such that a line normal to a tangent of an inner wall of the side wall portion 1 vertically cuts the side wall portion 1. The thickness dB of the bottom portion 2 is set such that a line normal to a tangent of the inner wall of the bottom portion 2 vertically cuts the bottom portion 2.

The thickness dB of the bottom portion 2 of the conventional heating resistor of this type is greater than the thickness dW of the side wall portion 1. In this sense, a resistance of the bottom portion 2 is much lower than that of the side wall portion 1. In addition, by forming slits 6 in the side wall and bottom portions, a zigzag-shaped heating conductor 7 is obtained. The width of the heating conducting 7 decreases toward the center of the bottom portion 2, since the bottom portion 2 is integrally formed with the cylindrical portion 4 which supports the bottom portion 2 and is connected to the power supply electrode portion 3.

Furthermore, since the thickness dB of the bottom portion 2 increases toward the center thereof, the cross-sectional area of the heating conductor 7 is substantially uniform from the periphery toward the center of the bottom portion 2. Unlike the case of the side wall portion 1, the bottom portion 2 does not have a resistance gradient. In other words, the bottom portion of the conventional heating resistor which has the above-mentioned bottom structure does not substantially contribute to heating of the crystal material in the melting pot coaxially surrounded by the heating resistor.

In the conventional resistor of the type described above, therefore, the temperature of only the crystal material portion in the vicinity of the side wall portion of the melting pot is raised, since the bottom portion 2 does not contribute to heating. As a result, a radial temperature gradient of the melt tends to be increased.

In an LEC monocrystalline pulling apparatus disclosed in Japanese Patent Publication No. 52-39787, a heater structure is shown wherein a temperature gradient along the direction of height of the heater is considered. However, even in this heater, as shown in FIGS. 5 and 6, the lower portion of the heater has a lower temperature than that of the upper portion thereof. As a result, the bottom portion of the heater substantially fails to sufficiently contribute to heating the molten material. In other words, this prior art improves only the temperature gradient along the direction of height of the melting pot. However, a concept for improving the radial temperature gradient of the melting pot is neither explicitly nor implicitly shown in Japanese Patent Publication No. 52-39787. Even in this heater, the radial temperature gradient of the crystal material tends to be increased.

The present inventors have made extensive studies and determined the fact that a large radial temperature gradient of the molten crystal material in the melting pot results in an increase in thermal strain in a crystal plane of a pulled crystal, dislocations in the crystal, nonuniform distribution of the dislocations, or nonuniform distribution of the impurity.

Especially in the LEC method, in order to decrease decomposition and scattering of elements with a high vapor pressure from the molten crystal material, the molten crystal material is sealed by a liquid sealing agent such as $B_2O_3$, and the single crystal is pulled up while the molten crystal material is pressurized by an inert gas at a high pressure.

High heat radiation from the melting pot occurs due to convection of the high-pressure gas, so that the radial temperature gradient of the molten crystal material in the melting pot in the LEC method becomes even greater than that in the CZ method.

For this reason, when a GaP single crystal is manufactured by the LEC method using the conventional heating resistor, a dislocation density in a wafer plane of the resultant single crystal is as high as $1 \times 10^5 \, cm^{-2}$. In addition, the dislocation distribution in the wafer plane is regarded as being nonuniform.

FIG. 2 shows a microphotograph of a crystal structure when a single crystal is pulled up by the LEC method using the conventional heating resistor, the resultant single crystal rod is cut into wafers, and wafer is then polished and etched by an RC etching solution, thereby generating etching pits (circular portions) corresponding to dislocations of the crystal. The high dislocation density wwithin the wafer plane and the nonuniform distribution of the disclocations result in degradation of the light-emitting efficacy and in variations in the light-emitting characteristics of a light-emitting diode obtained using such a wafer.

SUMMARY OF THE INVENTION

The present invention has been made in consideration of the conventional problems described above, and has for its object to provide a heating resistor of a single crystal manufacturing apparatus, wherein a radial temperature gradient of a molten crystal material becomes moderate and hence a temperature distribution becomes substantially uniform, so as to allow manufacture of a high-quality single crystal.

It is another object of the present invention to provide a heating resistor of a single crystal manufacturing apparatus for pulling up a single crystal by the LEC method, wherein both axial and radial temperature distributions within the melting pot are improved.

It is still another object of the present invention to provide a heating resistor wherein a temperature distribution along a direction of height of the heating resistor is determined such that the temperature is gradually increased in the direction toward a height "0", so that a temperature difference in a molten material along the radial direction of the melting pot becomes maximum at the center of the molten material and is set to be not more than 10° C.

In order to achieve the above objects of the present invention, there is provided a heating resistor of a single crystal manufacturing apparatus which has a structure such that a cylindrical side wall portion for coaxially surrounding a melting pot, a bottom portion for supporting said side wall portion, and a cylindrical portion which supports said bottom portion and which is connected to power supply electrodes are integrally formed, and a plurality of slits are formd extending along said side wall portion and said bottom portion such that said heating resistor is formed to constitute a heating conductor which is connected from one of said power supply electrodes to the other of said power supply electrodes in a zigzag manner, wherein said bottom portion has a maximum thickness which is not greater than that of said side wall portion, and said bottom portion has a minimum inner diameter which falls within a range of 20 to 80% of an inner diameter of a lowermost portion of said side wall portion.

BRIEF DESCRIPTION OF THE DRAWINGS

FIG. 2 is a microphotograph showing a crystal structure when a monocrystalline GaP wafer obtained using the heating resistor of FIG. 1 is etched;

FIGS. 6(A), 6(B) and 6(C) are respectively representations showing different heating methods of heating the melting pot;

FIGS. 8(a) and 8(b) are graphs respectively showing the relationship between the characteristics of the resultant single crystal and the change in diameter ratio of the heating resistor;

DETAILED DESCRIPTION OF THE PREFERRED EMBODIMENT

An embodiment of the present invention will be described with reference to the accompanying drawings.

Figure 1:
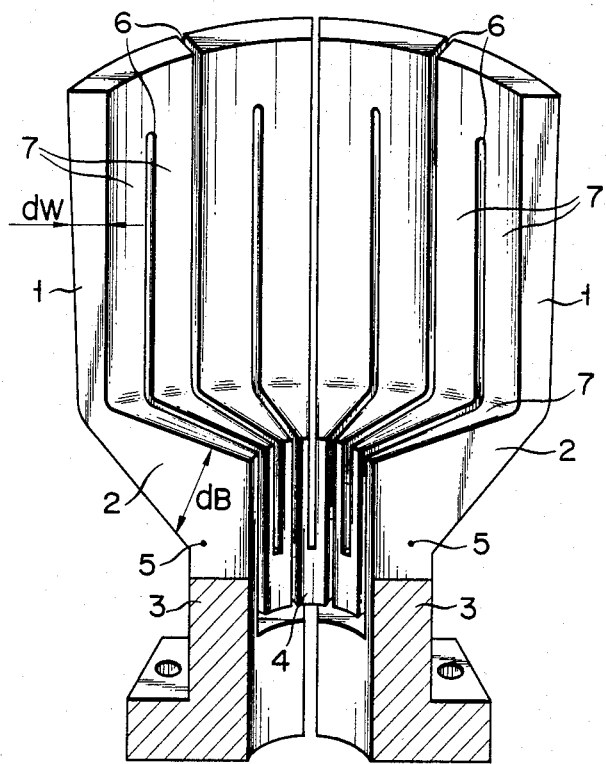
FIG. 1 is a sectional view of a conventional heating resistor.
Figure 3:
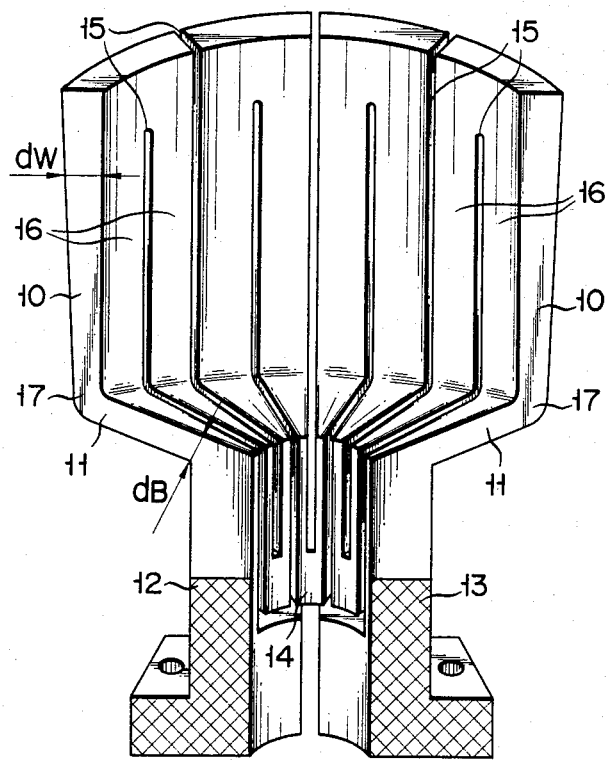
FIG. 3 is a sectional view of a heating resistor of a single crystal manufacturing apparatus according to an embodiment of the present invention.

FIG. 3 is a sectional view of a heating resistor of a single crystal manufacturing apparatus. This heating resistor has an integral construction constituted by a cylindrical side wall portion 10 which coaxially surrounds a melting pot, a bottom portion 11 for supporting the side wall portion 10, and a cylindrical portion 14 which supports the bottom portion 11 and which is connected to power supply electrodes 12 and 13. A plurality of slits 15 are formed extending along the side wall portion 10 and the bottom portion 11 to provide a heating conductor 16 which is connected between the electrode 12 and the electrode 13 in a zigzag shape. In addition, a portion of the bottom portion 11 which extends from a connecting portion between the side wall portion 10 and the bottom portion 11 to the cylindrical portion 14 has a tapered cross-section such that a maximum value dBO of a thickness dB of the bottom portion 11 is determined with respect to a maximum value dWO of a thickness dW of the side wall portion 10 to satisfy the inequality dBO≦dWO. In other words, the thickness dB of the bottom portion 11 must be equal to or smaller than the thickness dW of the side wall portion 10 so as to increase a resistance of the bottom portion 11. Furthermore, the thickness dB of the bottom portion 11 is set to be substantially uniform, so that the cross-sectional area of the heating conductor 16 becomes small toward the center of the base portion 11. Therefore, in the heating resistor having the bottom portion 11 as described above, heating of the molten crystal material in the melting pot can also be performed from the bottom portion 11 of the heating resistor. In particular, heating energy at the center of the bottom portion 11 is higher than that at the periphery thereof.

Figure 4:
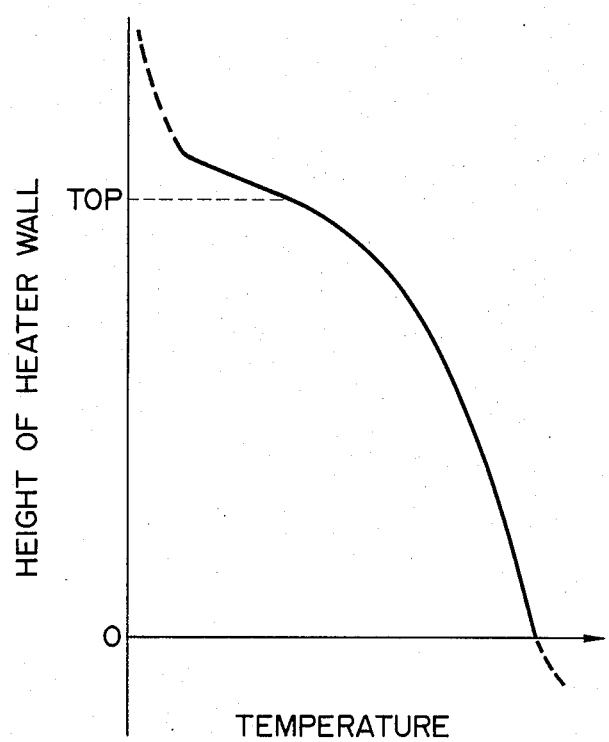
FIG. 4 is a graph showing the temperature distribution of the heating resistor of FIG. 3 along the height of the side wall portion.

The temperature gradient along the direction of height of the heating resistor is shown in FIG. 4, wherein as the height decreases toward height "0" (from the top of the side wall portion 10 to the junction between the side wall portion 10 and the bottom portion 11), the temperature gradually increases.

Furthermore, a minimum inner diameter RB of the bottom portion 11 of the heater preferably falls within the range of 20 to 80% of that of an inner diameter RW of a lowermost section (i.e., a connecting portion between the side wall portion 10 and the bottom wall 11), as shown in FIG. 4.

With reference to FIG. 6(A), when a melting pot 31 is heated from its side wall as indicated by arrows, a portion of a molten crystal material or melt 26 in the vicinity of the side wall of the melting pot 31 has a temperature which greatly differs from that of another portion of the molten crystal material 26 at the center of the melting pot 31, as indicated by the solid line x, resulting in inconvenience. However, when the entire bottom portion of the melting pot 31 is uniformly heated, portions of the molten crystal material 26 in the vicinity of the center and side wall of the melting pot 31 have a higher temperaure than that of intermediate portions, so that a W-shaped temperature distribution is obtained, as shown in FIG. 6(B). An increase in thermal strain of the inner portion of the single crystal occurs. Dislocation occurs along with such an increase in thermal strain. A polycrystalline structure is likely to develop during the pulling up of the crystal material 26, thereby lowering the yield of the single crystal. Due to these phenomena, it is difficult to obtain a stable single crystal. When the diameter of the bottom portion 11 falls within the range described above, the temperature distribution of the molten crystal material becomes substantially uniform, as shown in FIG. 6(C). In other words, the temperature gradient becomes moderate.

Figure 7:
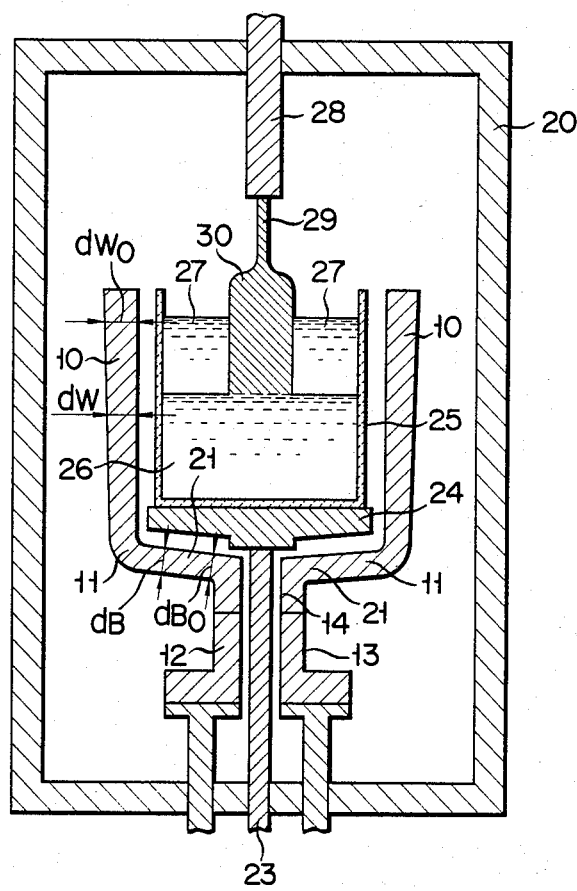
FIG. 7 is a schematic sectional view showing a single crystal being pulled up when the heating resistor of the present invention is used.

FIG. 7 is a sectional view of a single crystal manufacturing apparatus for manufacturing a GaP single crystal using the heating resistor described above.

Figure 5:
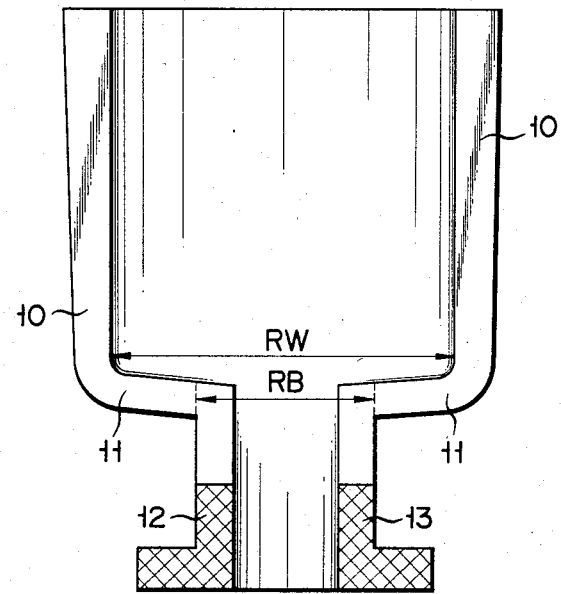
FIG. 5 is a representation showing the ratio of the inner diameter of the side wall portion to that of the bottom portion of the heating resistor of the present invention.

Nine types of heating resistor were used to manufacture different GaP single crystals. These heating resistors had identical dimensions except for the inner diameters RB (hole diameters of the respective bottom portions 11). The inner diameter RW (FIG. 5) of the lower portion of the side wall portion 10 of the respective heating resistors was 120 mm, and the height of the inner wall portion thereof was 100 mm. The maximum value dWO of the thickness dW of the side wall portion 10 was 15 mm, and a maximum value dBO of the the thickness dB of the bottom portion 11 (thickness of the connecting portion 21 between the side wall portion 10 and the bottom portion 11) was 15 mm (i.e., dBO/dWO=1). The height of each of the power supply electrodes 12 and 13 was 80 mm. However, as described above, the inner diameter RB (FIG. 5) of the respective heating resistors was 12 mm, 24 mm, 36 mm, 48 mm, 60 mm, 72 mm, 84 mm, 96 mm and 120 mm. The inner diameter of 120 mm corresponded to the case wherein the resistor type heating plate was omitted. A GaP single crystal was formed by the following process. A melting pot support 24 was mounted at one end of a melting pot supporting shaft 23 disposed through a cylindrical portion of the heating resistor described above. A quartz melting pot 25 having an inner diameter of 100 mm and a height of 90 mm was disposed to be coaxial with the heating resistor. One kg of GaP as a single crystal material and 200 g of $B_2O_3$ as a sealing agent were filled in the melting pot 25. The position of the melting pot 25 was adjusted such that the upper end of the melting pot 25 was aligned with that of the heating resistor. Thereafter, the GaP and $B_2O_3$ were heated and melted.

Under these conditions, thermocouples were mounted at the center of a seed pull-up shaft 28 and at a position spaced 25 mm apart from the center thereof, respectively. A temperature difference at an interface between a molten single crystal material 26 and the $B_2O_3$ sealing agent 27 was measured along the radial direction of the melting pot 25. A seed crystal 29 attached at the end of the seed pull-up shaft 28 was brought into contact with the molten single crystal material 26 by a predetermined technique. A single crystal rod having a diameter of 2 inches was pulled up while the seed crystal 29 was rotated. A resultant single crystal rod 30 was cut into wafers along the direction perpendicular to the movement of the seed pull-up shaft 28. The wafer was etched by an RC etching solution, and was subjected to measurement of the dislocation density.

Results will be described with reference to FIGS. 8(a) and 8(b). A temperature difference $\Delta T$ at the interface between the molten single crystal material 26 and the liquid sealing agent 27 was measured by the thermocouples mounted respectively at the center of the seed pull-up shaft 28 and at a position spaced 25 mm apart the center thereof along the radial direction of the melting pot. The temperature difference $\Delta T$ was smaller when a heating resistor having a smaller inner diameter RB was used. When a ratio RB/RW of the minimum inner diameter RB to the inner diameter RW of the cylindrical portion connected to the bottom portion 11 was used as a parameter, a relationship between the ratio RB/RW and the temperature difference $\Delta T$ was obtained, as shown in FIG. 8(a). When the ratio RB/RW falls within the range of 0.8 to 0.6, the temperature difference $\Delta T$ is greatly reduced. Upon a reduction in temperature difference $\Delta T$, the dislocation density of the pulled crystal is greatly decreased, as shown in FIG. 8(b). When the ratio RB/RW is set to be 0.6 (i.e., when the temperature difference $\Delta T$ is set to be less than 5° C.), dislocation will not occur. However, for value of the ratio RB/RW below 0.6, the temperature difference $\Delta T$ is gradually decreased. Furthermore, when the ratio RB/RW becomes less than 0.3, the temperature difference becomes 0. The pulled crystal can thus be free of dislocation in the ratio RB/RW range of 0.6 to 0.3. When the temperature difference is negative at the ratio RB/RW of not more than 0.3 (i.e., when the peripheral molten material has a lower temperature of that of the central molten material), dislocation occurs again such that the dislocation density is abruptly increased upon an increase in the absolute value of a negative temperature difference $\Delta T$. The dislocation density is $10^2/cm^2$ when the ratio RB/RW is set to be 0.2. As a result, a sufficiently low dislocation rate can be achieved. However, during the process, polycrystalline silicon components occur in a great amount. As a result, a high single crystal yield cannot be obtained. When the ratio RB/RW is set to be 0.1, small crystals are precipitated and float around the seed crystal during seeding. As a result, the desired single crystal cannot be formed.

According to the above results, when the ratio RB/RW falls within the range of 0.2 to 0.8 (i.e., when the resistor heater according to the present invention is used), the temperature distribution along the radial direction of the melting pot can be optimized. A low-dislocation crystal having a dislocation density of $10^4/cm^2$ or less can be obtained. In addition, when the ratio RB/RW falls within the range of 0.3 to 0.6, a non-dislocated crystal can be stably formed.

These results applied to the cases of all eight types of heating resistor used, having combinations of heights of 100 mm, 150 mm and 200 mm and inner diameters RW of 120 mm, 180 mm and 240 mm as follows: (1) h=100 mm and RW=180 mm; (2) h=100 mm and RW=240 mm; (3) h=150 mm and RW=120 mm; (4) h=150 mm and RW=180 mm; (5) h=150 mm and RW=240 mm; (6) h=200 mm and RW=120 mm; (7) h=200 mm and RW=180 mm; and (8) h=200 mm and RW=240 mm.

Figure 9:
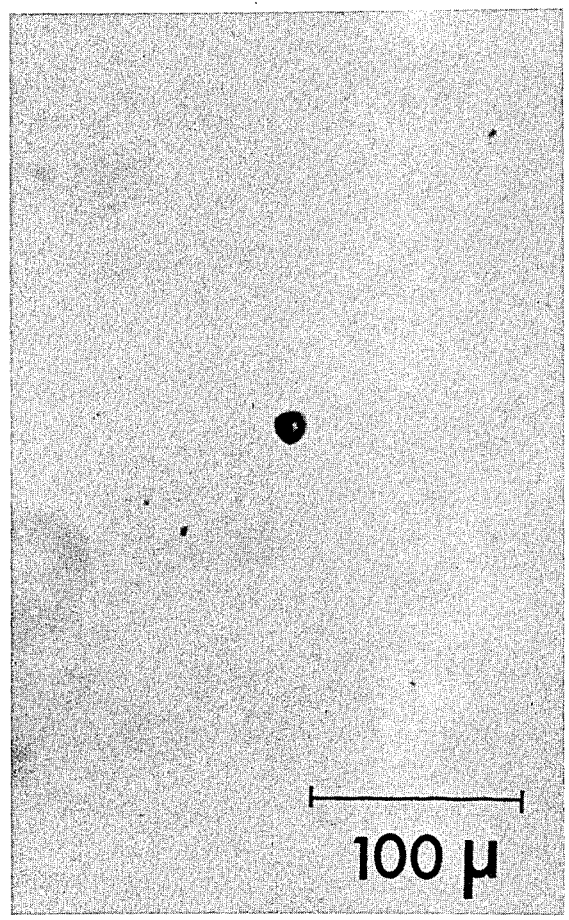
FIG. 9 is a microphotograph showing a crystal structure of a monocrystalline GaP wafer manufactured using the heating resistor of the present invention.

FIG. 9 shows a microphotograph of a monocrystalline GaP wafer obtained using the heating resistor where h=100 mm, RW=120 mm, dWO=15 mm, dB=15 mm, RB=60 mm, and the height of the electrode 13=80 mm. The seed crystal was brought into contact with a molten GaP single crystal material in the same manner as described above. A GaP single crystal was pulled up along the direction <111> to obtain a single crystal rod having a diameter of 2 inches. The rod was cut into wafers along the direction perpendicualr to the pull-up axis. The wafer was polished and etched by the RC etching solution so that etching pits appeared.

The EPD of the obtained GaP single crystal was $8 \times 10^2$ cm$^{-2}$, as compared with the EPD of $8 \times 10^4$ cm$^{-2}$ of the single crystal prepared using the conventional heating resistor. Therefore, by using the heating resistor of the present invention, the EPD can be greatly decreased.

In addition, the conventional heating resistor can only provide a V-shaped EPD distribution on the wafer plane, resulting in a completely nonuniform EPD. However, the heating resistor according to the present invention provides a U-shaped EPD distribution on the wafer plane, thereby providing a uniform EPD over a wide region within the wafer plane. In addition, when a green light-emitting diode is manufactured using the single crystal prepared using the heating resistor of the present invention, the light-emitting efficacy falls within the range of 0.6 to 0.7% and is twice that (0.3 to 0.4%) of the light-emitting diode prepared using the conventional heating resistor. Further, variation in the light-emitting characteristics of the light-emitting diode can be reduced to only half that of the conventional light-emitting diode.

In the above embodiment, the heating resistor has a construction such that the maximum value dBO (of the thickness dB of the bottom portion 11) of the connecting portion 21 between the bottom portion 11 and the cylindrical portion 14 and the maximum value dWO of the thickness dW of the side wall portion 10 have a ratio dBO/dWO equal to 1. It is essential to provide a heating resistor which satisfies the relation dBO/dWO≦1. However, in order to obtain a sufficient mechanical strength of the bottom portion for supporting the side wall portion, the relation dBO/dWO≧0.5 preferably obtains.

Figure 10:
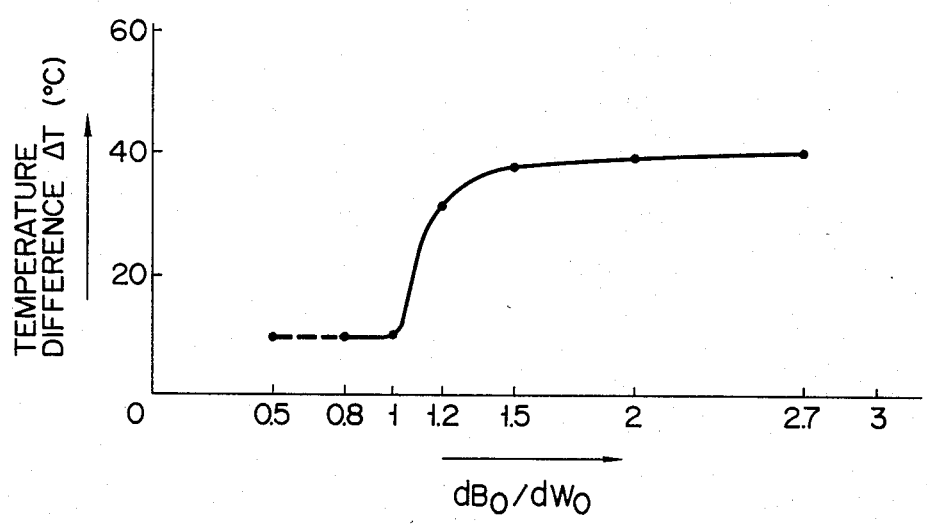
FIG. 10 is a graph showing the relationship between the change in thickness of the heating resistor and the temperature difference in the molten material in the melting pot along the radial direction.

In order to verify the effect under the assumption that dBO/dWO≦1, five types of heating resistor having different thicknesses dB of the bottom portions thereof were prepared as Control. The temperature difference at the interface between the molten single crystal material and the B$_2$O$_3$ sealing agent along the diameter of the melting pot was measured in the same manner as in the embodiment described above. Results are shown in FIG. 10.

The bottom portion of each of these heating resistors was tapered from the connecting portion between the side wall portion and the bottom portion to the cylindrical portion, respectively. The angle of taper varied to vary the thicknesses dB. At the connecting portion between the side wall portion and the bottom portion, the relation dW=dB was established. The maximum thickness dBO of the connecting portion between the bottom portion and the cylindrical portion and the maximum thickness dWO gave the ratio dBO/dWO to be 2.0, 1.5, 1.2, 1.0 and 0.8, respectively. It should be noted that the ratio RB/RW=50% was given. The temperature distribution along the diameter of the melting pot at the interface between the molten material and the sealing agent in each of these five types of heating resistor and in the conventional heating resistor having a ratio dBO/dWO of 2.7 was respectively measured at the central point of the melting pot and at an intermediate point between the central point and the side wall portion to obtain the respective temperature differences ΔT. As is apparent from FIG. 10 showing the measuring results as the temperature differences ΔT, when the ratio dBO/dWO decreases, the temperature difference ΔT is decreased. In particular, the temperature difference ΔT is abruptly decreased when dBO/dWO≦1 is established. Therefore, the condition dBO/dWO=1 is the critical point at which the temperature difference ΔT is greatly decreased. In addition, two types of heating resistors resembling the five types of heating resistors were prepared to perform the experiment in the same manner as described above. In this case, a similar relationship between the ratio dBO/dWO and the temperature difference ΔT was obtained, and it was again found that the ratio dBO/dWO=1 was the critical point.

When a GaP single crystal is manufactured using the heating resistor according to the present invention, the temperature gradient of the molten GaP single crystal material along the radial direction of the melting pot can become moderate. In other words, the temperature distribution can become substantially uniform. As a result, a high-quality GaP single crystal with a low EPD and a uniform EPD distribution within the wafer plane can be obtained.

In the above embodiment, the present invention is applied to the manufacture of the GaP single crystal having the direction <111> by using the heating resistor of the present invention. However, the crystal may be formed to have the direction <100> to obtain the same effect as in the embodiment.

In the embodiment, a GaP single crystal is formed using the heating resistor of the present invention. However, the present invention can also be applied to the manufacture of GaAs, InP, InSb or the like in accordance with the LEC method. In addition, an Si, LiTaO$_3$ or LiNbO$_3$ single crystal may be formed by the CZ method.

What is claimed is:

1. A heating resistor of a single crystal manufacturing apparatus which has a structure such that a cylindrical side wall portion for coaxially surrounding a melting pot, a bottom portion for supporting said side wall portion, and a cylindrical portion which supports said bottom portion and which is connected to power supply electrodes are integrally formed, and a plurality of slits are formed extending along said side wall portion and said bottom portion such that said heating resistor is formed to constitute a heating conductor which is connected from one of said power supply electrodes to the other of said power supply electrodes in a zigzag manner, wherein said bottom portion has a maximum thickness which is not greater than that of said side wall portion, and said bottom portion has a minimum inner diameter which falls within a range of 20 to 80% of an inner diameter of a lowermost portion of said side wall portion.

2. The heating resistor according to claim 1, wherein the slits are of substantially equal width through the length thereof.

3. The heating resistor according to claim 1, wherein said bottom portion has a minimum inner diameter which falls within a range of 30 to 60% of an inner diameter of a lowermost portion of said side wall portion.

4. The heating resistor according to claim 1, wherein the ratio of a maximum wall thickness dBO of said bottom portion to a maximum wall thickness dWO of said side wall portion, i.e., dBO/dWO falls in the range of 0.5 to 1.

5. The heating resistor according to claim 1, wherein said single crystal manufacturing apparatus is of a type which is adopted for carrying out LEC method.

6. A heating resistor of a single crystal manufacturing apparatus which has a structure such that a cylindrical side wall portion for coaxially surrounding a melting pot, a bottom portion for supporting said side wall portion, and a cylindrical portion which supports said bottom portion and which is connected to power supply electrodes are integrally formed, and a plurality of slits are formed extending along said side wall portion and said bottom portion such that said heating resistor is formed to constitute a heating conductor which is connected from one of said power supply electrodes to the other of said power supply electrodes in a zigzag manner, wherein said bottom portion has a maximum thickness which is not greater than that of said side wall portion, and said bottom portion has a minimum inner diameter which falls within a range of 20 to 80% of an inner diameter of a lower most portion of said side wall portion, a temperature distribution along said side wall portion being such that the lower the side wall portion is, the higher the temperature becomes, and the temperature distribution along the radial direction of molten crystal material in the pot being such that the nearer the center of the molten crystal material, the lower the temperature becomes with a temperature difference between the peripheral portion and the center portion of the molten crystal material being 10° C. or less.

* * * * *